United States Patent
Lienau et al.

(10) Patent No.: US 7,023,727 B2
(45) Date of Patent: Apr. 4, 2006

(54) NON-VOLATILE FERROMAGNETIC MEMORY HAVING SENSOR CIRCUITRY SHARED WITH ITS STATE CHANGE CIRCUITRY

(75) Inventors: Richard M. Lienau, Pecos, NM (US); James Craig Stephenson, Salt Lake City, UT (US)

(73) Assignees: Pageant Technologies, Inc., Toronto (CA); Estancia Limited, Providenciales (TC)

( * ) Notice: Subject to any disclaimer, the term of this patent is extended or adjusted under 35 U.S.C. 154(b) by 0 days.

(21) Appl. No.: 10/258,289

(22) PCT Filed: Jun. 15, 2001

(86) PCT No.: PCT/US01/19151

§ 371 (c)(1),
(2), (4) Date: Jun. 3, 2004

(87) PCT Pub. No.: WO01/97227

PCT Pub. Date: Dec. 20, 2001

(65) Prior Publication Data

US 2004/0264243 A1 Dec. 30, 2004

Related U.S. Application Data

(60) Provisional application No. 60/211,779, filed on Jun. 15, 2000.

(51) Int. Cl.
*G11C 11/14* (2006.01)

(52) U.S. Cl. .................. 365/171; 365/145; 365/158

(58) Field of Classification Search .............. 365/171, 365/145, 158
See application file for complete search history.

(56) References Cited

U.S. PATENT DOCUMENTS

| | | |
|---|---|---|
| 4,791,604 A | 12/1988 | Lienau et al. |
| 5,068,826 A | 11/1991 | Matthews |
| 5,295,097 A | 3/1994 | Lienau |
| 5,652,445 A | 7/1997 | Johnson |
| 5,654,566 A | 8/1997 | Johnson |
| 5,926,414 A | 7/1999 | McDowell et al. |
| 6,051,441 A | 4/2000 | McDowell et al. |
| 6,140,139 A | 10/2000 | Lienau et al. |
| 6,201,259 B1 | 3/2001 | Sato et al. |
| 6,229,729 B1 | 5/2001 | Lienau |
| 6,266,267 B1 | 7/2001 | Lienau |
| 6,288,929 B1 * | 9/2001 | Lienau ........................ 365/145 |
| 6,317,354 B1 | 11/2001 | Lienau |
| 6,330,183 B1 * | 12/2001 | Lienau ........................ 365/170 |
| 6,341,080 B1 | 1/2002 | Lienau et al. |
| 6,538,921 B1 * | 3/2003 | Daughton et al. ........... 365/171 |
| 6,809,959 B1 * | 10/2004 | Johnson ........................ 365/170 |
| 6,873,546 B1 * | 3/2005 | Lienau ........................ 365/171 |

* cited by examiner

*Primary Examiner*—Tuan T. Nguyen
(74) *Attorney, Agent, or Firm*—Morgan, Lewis & Bockius LLP

(57) ABSTRACT

A ferromagnetic memory cell is disclosed having a base (21), oriented in a horizontal plane, a bit (19), made of a ferromagnetic material, and a sense/write line (20), positioned proximate the bit (19) sufficient to detect the directed polarity of the bit when a first current is applied thereto, and to direct the polarity of the bit when a second larger current is applied thereto in a given direction. The bit (19) has a height that is oriented perpendicular to the horizontal plane of the base, and a polarity that can be directed along the height.

8 Claims, 3 Drawing Sheets

NON-VOLATILE FERROMAGNETIC MEMORY HAVING SENSOR CIRCUITRY SHARED WITH ITS STATE CHANGE CIRCUITRY

PRIORITY OF THE INVENTION

This application claims priority to U.S. Provisional Application No. 60/211,779, filed Jun. 15, 2000, now abandoned.

RELATED PATENT APPLICATIONS

The following patent applications, which are hereby incorporated by reference for their supporting teachings, are related to the present invention:

U.S. application Ser. No. 09/515,963, filed Feb. 29, 2000, issued as U.S. Pat. No. 6,229,729;

Ser. No. 09/516,175, filed Feb. 29, 2000;

Ser. No. 09/515,964, filed Feb. 29, 2000; and

Ser. No. 09/516,453, filed Feb. 29, 2000.

THE FIELD OF THE INVENTION

The present invention relates to non-volatile random access memory. More particularly, the present invention relates to non-volatile ferromagnetic memory having common sensor and state change circuitry.

BACKGROUND OF THE INVENTION

Computer memory technology has experienced profound advances in the last two decades. One of the first computer memories involved magnetic core memory technology. To form each magnetic core, a miniature toroidal-shaped ferrite core was interwoven into a fine matrix of wires. By applying a current through the wires, th core would be programmed with either a north or south direct flux path that would correspond to a logic one or zero. The advantage of magnetic core memory is that it is non-volatile, or does not need to be refreshed to remembered the store logical signal. Additionally, core memory is also "radiation-hard" or unaffected by ionizing radiation like gamma rays. However, the assembly of the magnetic core array was very labor intensive and was quickly abandoned when semiconductor processes were developed.

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. The constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a non-volatile memory device that does not need to be refreshed and is inexpensive and quick to make. Additionally, in a ferromagnetic memory array, it has generally been necessary to provide a wholly separate circuit to detect the polarity, and thus the binary value, of the remnant magnetic field of a ferromagnetic digital memory cell. For example, many current ferromagnetic memories use such techniques as "giant magneto resistance" and the Hall effect to sense the magnetic polarity of memory bits. These require circuitry in addition to that used for state change, and in some cases many extra steps to fabricate. The requirement of a separate sensing circuit adds considerably to the time and expense of fabrication. This additional circuitry also limits the density of the memory cells in an array, and effects the time required to read, or sense the magnetic polarity, or value.

In the digital memory arena, especially random access memory, fast, dense non-volatility is an advantage. Accordingly, it is desirable to have a non-volatile memory array wherein the remnant magnetic field is sensed with the same circuitry used to write, or effect the state change of, a ferromagnetic bit in such a memory cell.

Examples of patents related to non-volatile RAM, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remnant, (i.e. permanent) states, upon the simultaneous application of electrical pulses to a pair of conductors intersecting adjacent the selected cell. Each electrical pulse has an amplitude which is insufficient to inductively switch the remnant state of the selected cell. However, the combined amplitude of the electrical pulses is at least equal to the amplitude required for such a switch.

U.S. Pat. No. 5,068,826 to Mathews teaches a non-volatile, static magnetic memory device, whose operation is based on the Hall effect. The device includes a magnetic patch which stores data in the form of a magnetic field, a semiconductor Hall bar, and a pair of integrally-formed bipolar transistors which are used for amplifying and buffering the Hall voltage produced along the Hall bar. In use, current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. Finally, a system of current carrying conductors is employed for writing data to individual magnetic patches.

U.S. Pat. No. 5,295,097 to Lienau teaches a nonvolatile random access memory having a substrate that carries separate magnetically polarizable domains. Each domain is surrounded by a full write loop member, and arranged to penetrate a Hall channel of a dual drain FET with its residual magnetic field. The domains are organized in word rows and bit columns, are each written to by a single full write current through the surrounding loop member, and each read by a comparator connected to the FET drains. Independent separate write lines and read lines are used in writing and reading the values of each magnetic bit.

U.S. Pat. No. 4,791,604 to Lienau et al. teaches a sheet random access memory (SHRAM). The SHRAM is a non-volatile and transportable memory characterized by its cell density and relatively small size and power requirements, but having the nonvolatile character and rugged transportability of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stored within the core and read by the sensing device from a gap defined by the core. Memory cells according to the invention can thus be arranged and organized to form destructive readout RAMs, or nondestructive readout rams in both serial and parallel form.

U.S. Pat. No. 6,229,729 to Lienau teaches a non-volatile RAM device which utilizes a plurality of ferromagnetic bits each surrounded by a write coil for directing the remnant polarity thereof is disclosed. The direction of magnetic remnance in each bit is dictated by the direction of a current induced into write coil. Further, a magneto sensor comprising a magneto resistor coupled to a diode is placed approximate each bit. The magneto resistor is coupled to a sense line, and receives current at a first point of attachment, and returns current at a second point of attachment. The current passing across magneto resistor is biased in a direction either right or left of the original current flow direction. If current is biased toward the anode end of diode then it is complimentary to the preferred flow direction of diode, and flows easily there across. The ultimate effect is that the serial resistance of magneto resistor is reduced, allowing a greater amount of current to pass into the sense line. When current is biased toward the cathode end of diode, then it is contrary to the preferred flow direction of the diode, and does not flow easily there across. The ultimate effect is that the serial resistance of magneto resistor is increased, allowing a smaller amount of current to pass into sense line. The presence and amount of current found in the sense line between the bit and the detector determines whether a digital value of "1" or "0" is stored in the magnetic bit. A method for storing binary data is also disclosed.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minimum size MOS device, a small cell may be realized that compares favorably with a conventional DRAM of FLASH memory cell. The greater degree of control over the magnetic field afforded by the magnetic structures enables the cross-coupling between cells in a memory array to be minimized.

U.S. Pat. No. 3,727,199 to Lekven teaches a magnet memory element and a process for producing such elements in plurality to constitute a static magnetic memory or digital information storage system. Individual binary storage members are afforded directionally preferential magnetic characteristics by flux circuits to establish the preferred axids of magnetization. Conductors for driving the individual binary storage members (for storing and sensing) are provided in an organized pattern to accomplish selectivity. A batch production process is also disclosed.

None of the foregoing references disclose a non-volatile memory array wherein the remnant magnetic field is sensed with the same circuitry used to write, or effect the state change of a ferromagnetic bit in such a memory cell.

SUMMARY OF THE INVENTION

There is therefore provided non-volatile ferromagnetic memory having common sensor and state change circuitry. The ferromagnetic memory cell has a base oriented in a horizontal plane, a bit and a sense/write line. The bit is made of a ferromagnetic material, having a height that is oriented perpendicular to the horizontal plane of the base, and a polarity that can be directed along the height. The sense/write line is positioned proximate the bit sufficient to detect the directed polarity of the bit when a first current is applied thereto, and to direct the polarity of the bit when a second larger current is applied thereto in a given direction.

In one embodiment, the wave induced into the sense line is a positive wave and represents a binary "1." In another embodiment, the wave induced into the sense line is a negative wave and represents a binary "0." The write line may also circumscribe proximate a periphery of the bit.

A method of storing and retrieving binary data is also provided. In this method, a memory bit is provided that is made of ferromagnetic material. The memory bit also has a polarity that is capable of being directed. The polarity is directed by sending a first current along a write line, which is in magnetic communication with the bit, in a certain direction. The polarity of the bit is then detected by sending a second smaller current along the write line, such that information about the detected polarity is transferred through the write line to a detector coupled thereto.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

It is noted that the drawings of the invention are not so scale. The drawings are merely schematic representations, not intended to portray specific parameters of the invention. The drawings are intended to depict only selected embodiments of the invention, and therefore should not be considered to limit the scope of the invention. The invention will be described with additional specificity and detail through the use of the accompanying drawings. Like numbering between figures represent like elements.

DETAILED DESCRIPTION OF THE PREFERRED EMBODIMENT(S)

Figure 1:
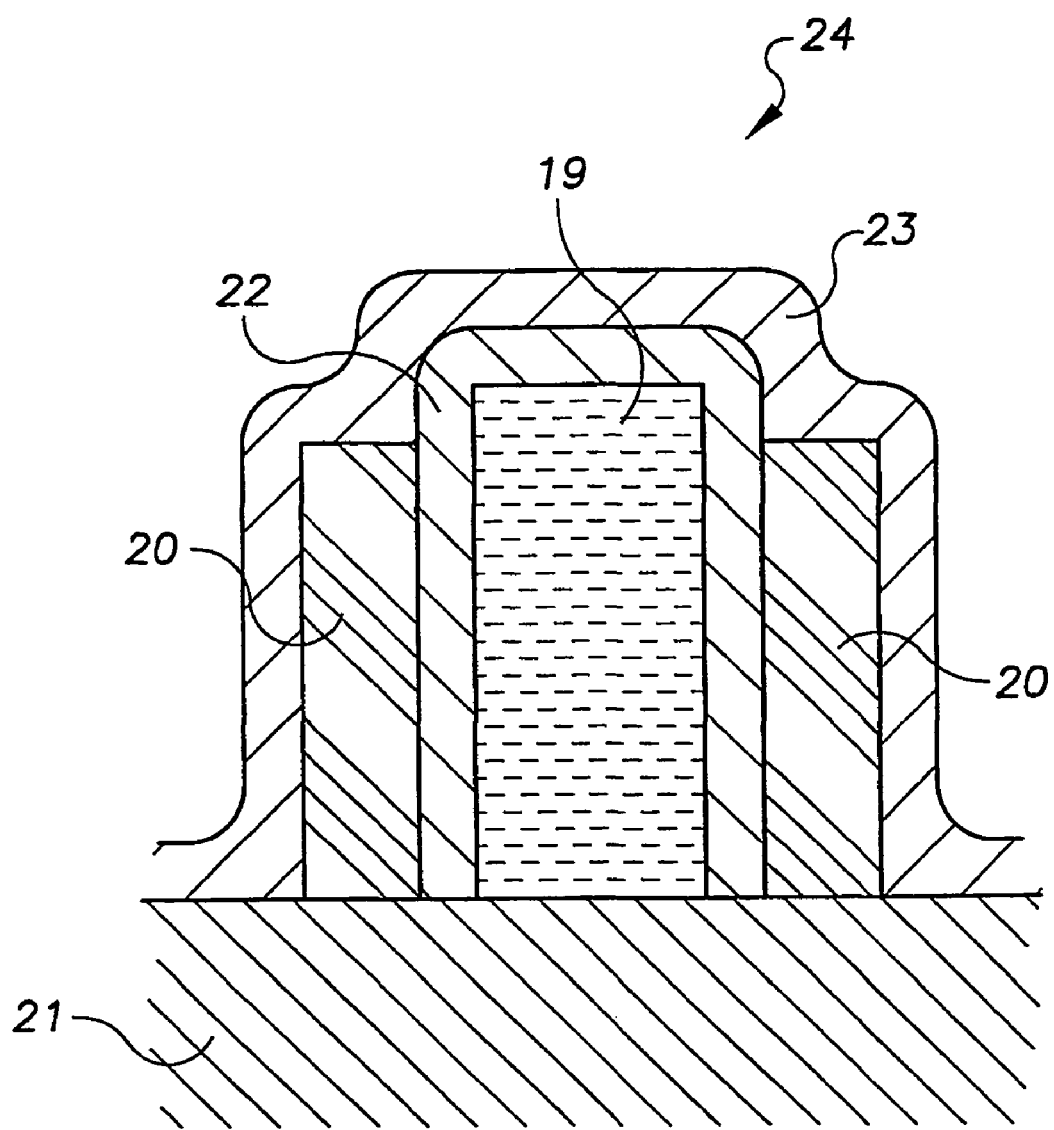
FIG. 1 is a cross-section of the ferromagnetic memory cell of the present invention.
Figure 2:
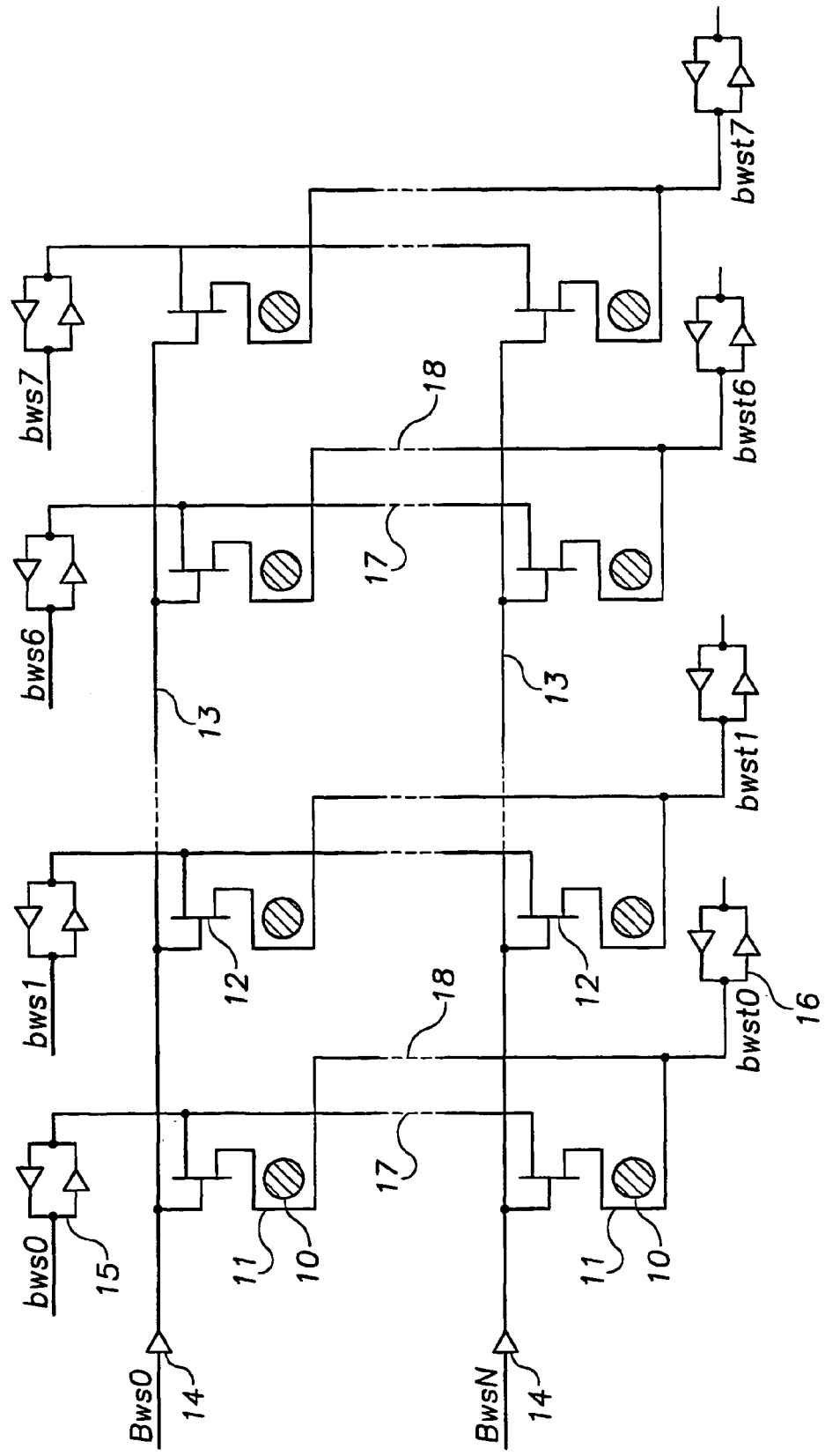
FIG. 2 is a schematic of a digital random access memory array according to the present invention.

A non-volatile digital micron or sub-micron scale ferromagnetic memory cell is shown in cross section in FIG. 1. The memory cell consists of a single stick-like ferromagnet, or bit 19, whose height to width, or aspect ratio, is greater than 1:1. The ferromagnetic bit 19 is fabricated normal to the plane of the substrate 21, which could be silicon, glass, GaAs, or other suitable material, and is proximate a single conductor loop 20. The magnetic state-change of the bit 19 is effected by the single conductor loop, or coil 20 that may substantially circumscribe the bit 19. The coil 20 is connected to write, or state-change driver circuitry 15, 16 as shown in FIG. 2. The coil 20 could be of Al, Cu or any other suitable conductor material.

In FIG. 1, the coil is shown circumscribing the bit 19 approximately 270 degrees. However, it is noted that the coil 20 could be configured in virtually any way proximate the bit, so long as it could still effect a magnetic state-change in the bit 19.

The circuitry 15, 16 is capable of driving current through the coil 20, thus coercing the change of state, or magnetic polarity, of the ferromagnetic bit 19. The magnetic polarity, and thus the binary condition, of the bit 19 is detected, or sensed, using the same loop, or coil 20, and its attendant circuitry. This is accomplished by feeding a unidirectional current through the loop 20, substantially lower than that used to coerce the ferromagnetic bit 19, and detecting the disturbance to the sense current caused by the remnant magnetic field present in, and surrounding, the ferromagnetic bit 19.

Insulation 22 is shown between the ferromagnetic bit 19 and the set coil 20. The insulation could be made of any appropriate insulating material such as $SiO_2$ or $Si_3N_4$. An additional layer of insulation 23 is also shown overlaying the cell 24. Again, this insulation could be made of $SiO_2$, or $Si_3N_4$, or any other suitable material. It is also noted that matrix interconnects are not shown for the sake of clarity.

FIG. 2 is a schematic of a digital random access memory array employing such a technology. In this figure can be seen the ferromagnetic bits 10 of a plurality of individual memory cells. State-change/sense loops, or coils 11, surround each cell bit 10. Transistor switches 12 select the cells to be changed (written) or sensed (read). During write, or state-change time, the selected byte row driver 14 is enabled, feeding a signal to all of the transistors 12 in the selected row 13. At the same time, drivers 15, 16 are sequentially gated "on" in conventional memory control fashion. Current is then directed through bit drive lines 17, 18 thereby coercing the selected bit 10 to the desired magnetic polarity. The polarity of the bit can then be read as a binary value of "zero" (0) or "one" (1).

During read, or sense, time, just as under a write condition, a selected byte driver 14 is enabled, thus gating "on" the associated byte row transistors 12 through gate line 13. In this situation, however, a single, low-current, unidirectional signal is transmitted between the bit column output drivers 15, 16.

Circuits 16, designated as bwst0 through bwst7, also act as sensor receptors. They will receive and detect any distortions in the pulsed current introduced to the selected cell bits caused by the sense current conflicting with the remnant bit magnetic field.

Figure 3A:
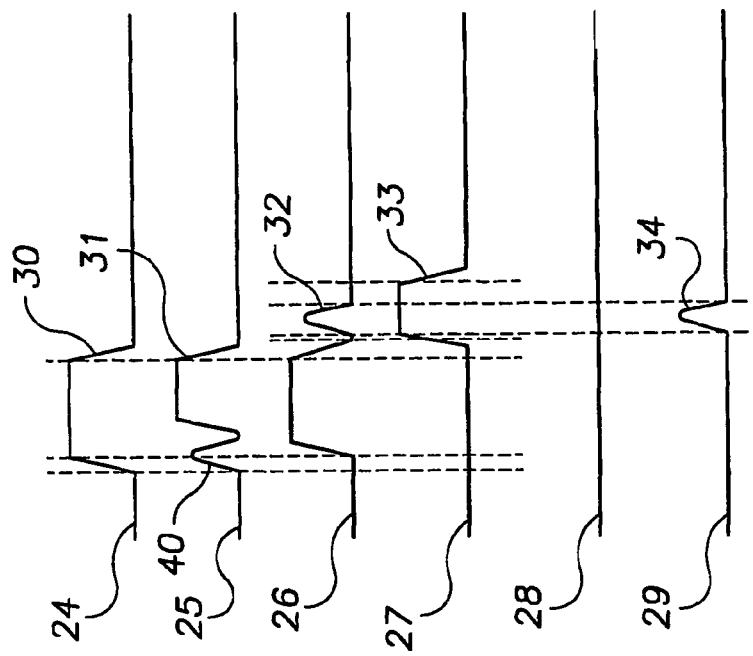
FIG. 3A depicts two current waveforms as presented to the receptor circuits.

FIG. 3A depicts two current waveforms 35 and 36, as presented to the receptor circuits 16. These are the results of interference with the rising edge of the sense pulse and the incidental remnant magnetic polarity of a given cell ferromagnetic bit. The dashed line 37 represents the coincident terminus of the charge time of the two pulses. The differential between waves 35 and 36 reflects the differential between the two possible magnetic polarities.

Figure 3B:
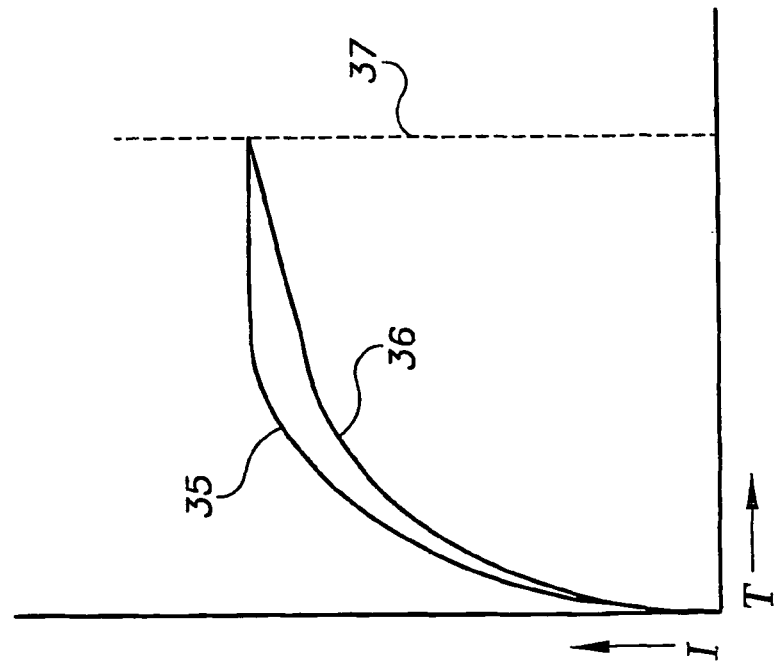
FIG. 3B depicts the voltage waveforms of the cell bit interference.

FIG. 3B depicts the voltage waveforms 24, 25, 26, 27, 28, and 29 of the cell bit interference. Waveform 24 represents the unidirectional read, or sense, pulse 30 fed between the bit driver and receptor circuits 15 and 16 (FIG. 1). Waveform 25 shows the results 31 of the interference with one polarity at the rise of the sense pulse, with a "little boy" pulse 40 prior to the steep incline of the major wave. Waveform 26 depicts the opposite, with the small reactive pulse 32 on the fall of the major sense pulse. Form 27 shows the read, or sense gate, or strobe, pulse 33 used to test the results of the sense current. Line 28 represents the end result of a strobe with the condition at form 25, wherein there is no following "little boy" pulse. Waveform 29 shows the result 34 of a coincidence between the strobe 33 and the pulse at 32.

Thus the receptor circuits are designed to determine the polarity, and thus the binary value, of selected ferromagnetic cell bits.

Several methods may be employed to make this cell, including, but not limited to, electroplating, sputtering, E-beam deposition, chemical vapor deposition and molecular beam epitaxy.

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

What is claimed is:

1. A ferromagnetic memory cell, comprising:
   a) a base (21), oriented in a horizontal plane;
   b) a bit (19), made of a ferromagnetic material, having;
      i) a height that is oriented perpendicular to the horizontal plane of the base, and
      ii) a polarity that can be directed along the height; and
   c) a sense/write line (20), positioned proximate the bit (19) sufficient to detect the directed polarity of the bit when a first current is applied thereto, and to direct the polarity of the bit when a second larger current is applied thereto in a given direction.

2. The memory cell of claim 1, wherein a positive current or waveform induced into the sense line represents a binary "1."

3. The memory cell of claim 1, wherein the a negative current or waveform induced into the sense line represents a binary "0."

4. The memory cell of claim 1, wherein said write line circumscribes proximate a periphery of the bit.

5. The method of storing and retrieving binary data, comprising the steps of:
   a) providing a memory bit, made of ferromagnetic material, having a polarity capable of being directed;
   b) directing the polarity of the bit by sending a first current along a write line, which is in magnetic communication with the bit, in a certain direction; and
   c) detecting the polarity of the bit by sending a second smaller current along the write line, such that information about the detected polarity is transferred through the write line to a detector coupled thereto.

6. The method of claim 5, wherein a positive current or waveform induced into the sense line represents a binary "1."

7. The method of claim 5, wherein a negative current or waveform induced into the sense line represents a binary "0."

8. The method of claim 5, wherein said write line surrounds said ferromagnetic bit.

* * * * *